United States Patent [19]

Iadanza

[11] Patent Number: 5,745,422
[45] Date of Patent: Apr. 28, 1998

[54] CROSS-COUPLED BITLINE SEGMENTS FOR GENERALIZED DATA PROPAGATION

[75] Inventor: Joseph A. Iadanza, Hinesburg, Vt.

[73] Assignee: International Business Machines Corporation, Armonk, N.Y.

[21] Appl. No.: 748,076

[22] Filed: Nov. 12, 1996

[51] Int. Cl.$^6$ .................. G11C 7/00; G11C 7/02; G11C 8/00; G11C 5/06
[52] U.S. Cl. .................. 365/203; 365/207; 365/208; 365/230.06; 365/63
[58] Field of Search .................. 365/203, 207, 365/230.06, 63

[56] References Cited

U.S. PATENT DOCUMENTS

| | | | |
|---|---|---|---|
| 4,689,494 | 8/1987 | Chen et al. | 307/202.1 |
| 4,694,433 | 9/1987 | Wiedmann | 365/230 |
| 4,807,195 | 2/1989 | Busch et al. | 365/207 |
| 4,980,860 | 12/1990 | Houston et al. | 365/63 |
| 4,989,055 | 1/1991 | Redwine | 357/23.6 |
| 5,023,837 | 6/1991 | Schreck et al. | 365/185 |
| 5,198,995 | 3/1993 | Dennard et al. | 365/149 |
| 5,313,432 | 5/1994 | Lin et al. | 365/230.06 |
| 5,347,487 | 9/1994 | Dao et al. | 365/189.05 |
| 5,365,483 | 11/1994 | Vinal | 365/203 |
| 5,394,364 | 2/1995 | Masuda | 365/189.05 |
| 5,414,664 | 5/1995 | Lin et al. | 365/218 |
| 5,414,824 | 5/1995 | Grochowski | 395/400 |
| 5,416,743 | 5/1995 | Allan et al. | 365/203 |
| 5,440,506 | 8/1995 | Longway et al. | 365/104 |
| 5,440,513 | 8/1995 | Smith | 365/190 |
| 5,444,654 | 8/1995 | Hara et al. | 365/177 |
| 5,457,647 | 10/1995 | McClure | 365/63 |
| 5,519,655 | 5/1996 | Greenberg | 365/189.02 |

OTHER PUBLICATIONS

IBM Technical Disclosure Bulletin. "Dense ROM Architecture for CMOS Gate Arrays." Vol. 31. No. 1. pp. 125–126. Jun. 1988.
U.S. Patent Application Serial No. 08/528,177, entitled "Methods and Systems for Improving Memory Component Size and Access Speed, Including Splitting Bit Lines and Alternate Pre-Charge/Access Cycles", filed Sep. 14, 1995.

*Primary Examiner*—David C. Nelms
*Assistant Examiner*—Trong Phan
*Attorney, Agent, or Firm*—Heslin & Rothenberg, P.C.

[57] ABSTRACT

Apparatus and methods for cross-coupling bitline segments in a memory array are provided. Bitline segments, each having a plurality of drive circuits and output circuits connected thereto, are cross-coupled such that the states of a first bitline segment can be transmitted to another bitline segment. The segments are conductively isolated such that their resistance-capacitance characteristics can be controlled while providing bi-directional data transfer along the entire length of the segmented bitline. Embodiments are also disclosed that support cross-coupling of bitline segments which are operated using pre-charge/discharge techniques.

30 Claims, 5 Drawing Sheets fig. 1
PRIOR ART fig. 2
PRIOR ART fig. 3

CROSS-COUPLED BITLINE SEGMENTS FOR GENERALIZED DATA PROPAGATION

RELATED APPLICATION INFORMATION

This application relates to the following commonly assigned, copending U.S. patent applications:

Application Ser. No. 08/575,312, entitled "Field Programmable Memory Array," filed Dec. 20, 1995; and Application Ser. No. 08/575,422, entitled "System For Implementing Write, Initialization, And Reset In A Memory Array Using A Single Cell Write Port," filed Dec. 20, 1995.

Each of these applications is hereby incorporated by reference herein in its entirety.

TECHNICAL FIELD

This invention relates to digital memory design. More particularly, this invention relates to an apparatus and method for bi-directional data transmission on bitline segments having multiple data entry and exit points.

BACKGROUND OF THE INVENTION

Figure 1:
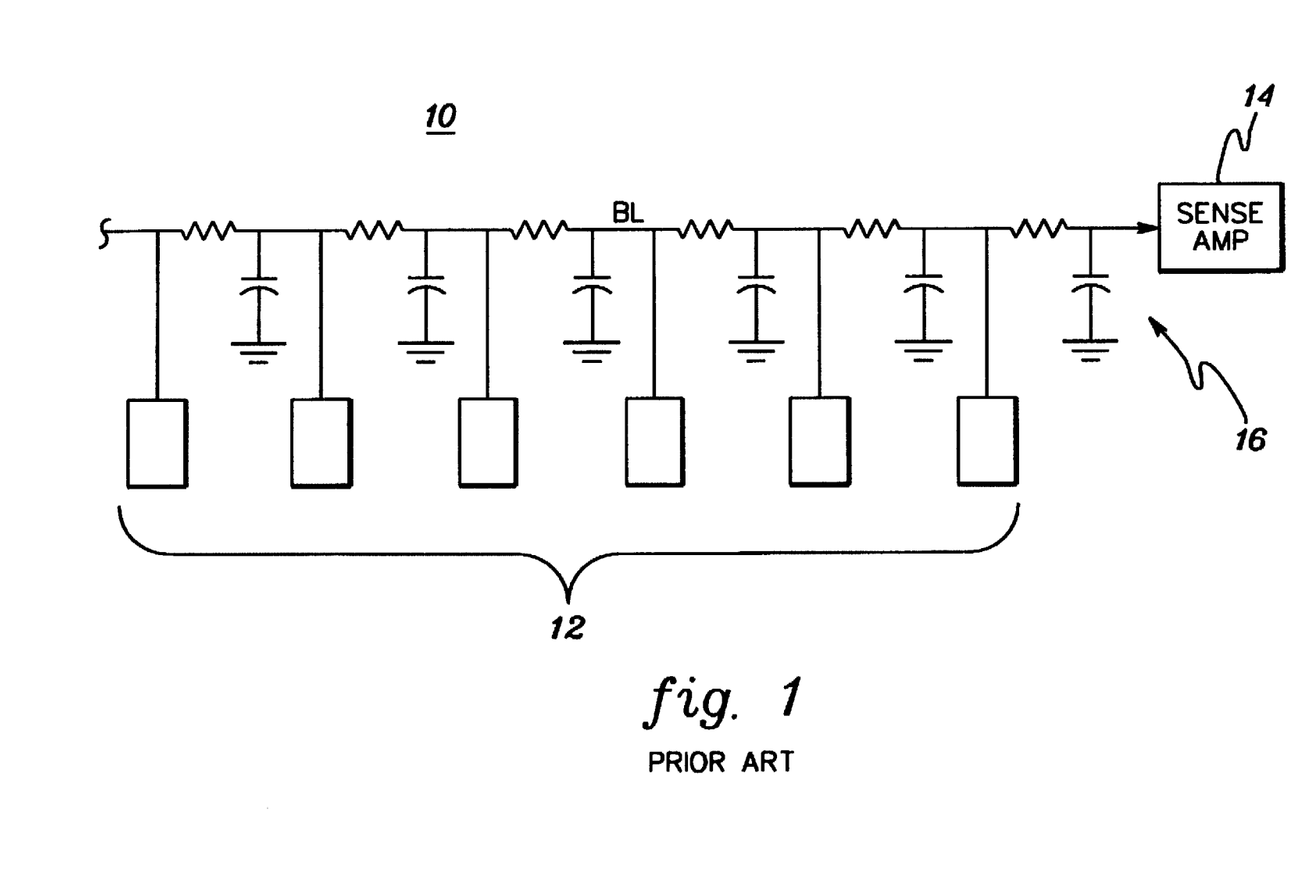
FIG. 1 depicts a conventional bitline shared by a plurality of bitline drive devices and a single-point sense amplifier.

Of major concern during the design of a high performance digital memory array is the minimization of parasitic resistance and capacitance associated with data bitlines used to write data to, and read data from memory cells of the array. In both fixed array and ASIC-type growable array design, the length, and therefore the parasitic behavior, of the data bitlines is often constrained to attain high performance bitline characteristics. FIG. 1 depicts a typical bitline structure 10 in which a plurality of bitline drive devices 12 (e.g., discharge or charging devices controlled by, or placed within respective memory cells) are coupled to bitline BL. A sense amplifier or similar device 14 is conventionally employed at a single point along bitline BL to write data to, or read data from the bitline. As discussed above, parasitic resistance and capacitance terms (depicted as equivalent RC terms 16 along bitline BL) often constrain the length of the bitline in order to attain a higher level of performance.

These problems are magnified in programmable memory arrays of the type disclosed in the above-incorporated U.S. patent application entitled Field Programmable Memory Array ("FPMA"). Unlike fixed or ASIC growable arrays, a programmable memory array, possibly implemented as part of a larger Field Programmable Gate Array ("FPGA"), may require bitlines of great length. These bitlines, when selected for use via FPMA/FPGA configuration memory, allow the connection of smaller RAMS or sub-arrays within the programmable memory array to form a particular array size; and/or transfer data read from a given sub-array to a bitline output circuit (e.g., an I/O port) most suitable for place and route to logic circuits in the FPGA.

Figure 2:
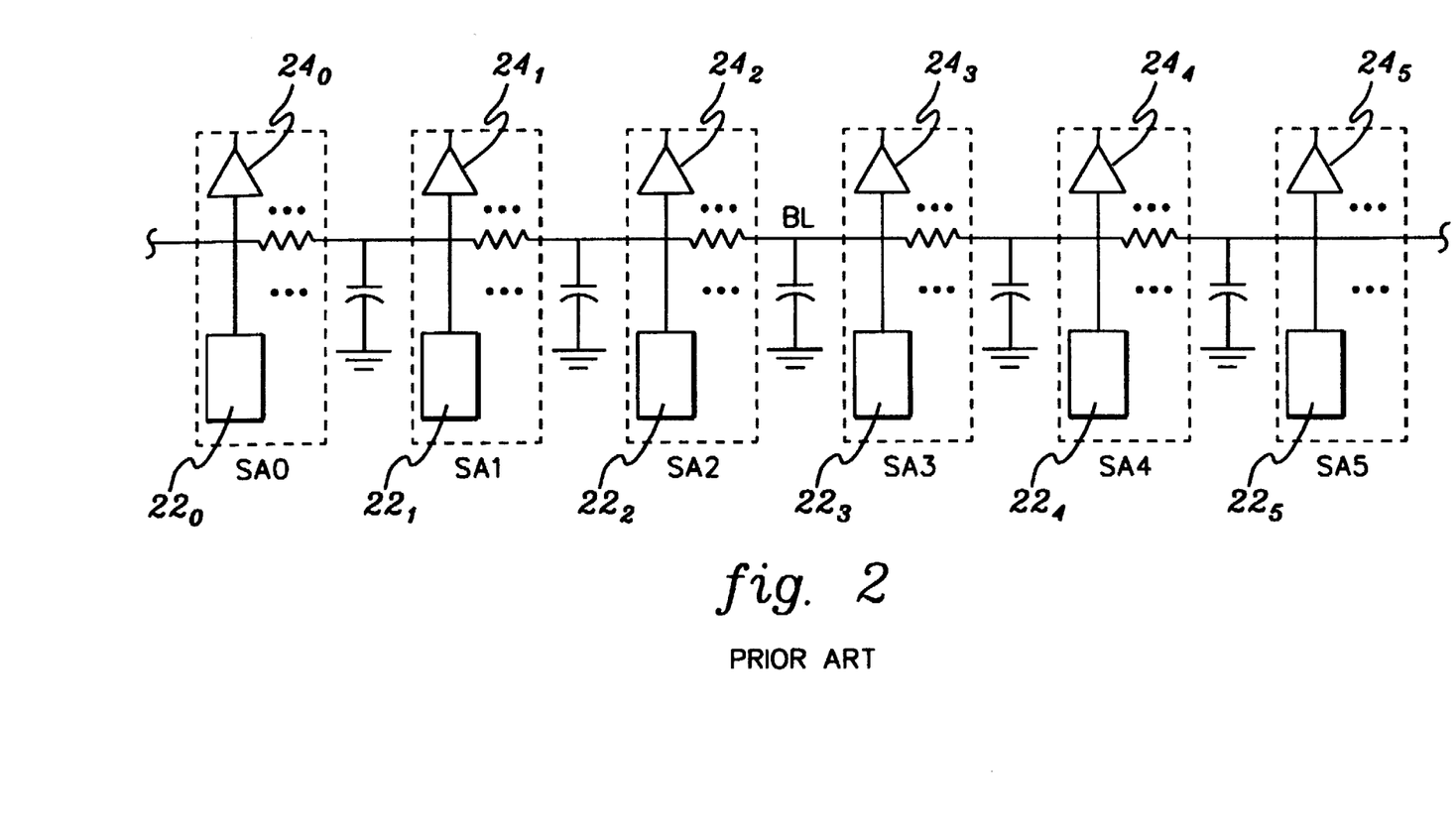
FIG. 2 depicts a conventional long bitline BL shared by a plurality of memory sub-arrays SA0–SA5, each sub-array having placed therein a plurality of bitline drive devices and a plurality of output circuits coupled to the bitline.

As an example, and with reference to FIG. 2, a programmable memory array may be designed in which sub-arrays SA0–SA5 all share, and are capable of driving, bitline BL. Each sub-array may have one or more output circuits 24, and one or more bitline drive devices 22 (e.g., discharge or charging devices controlled by, or placed within respective memory cells, or lower echelon bitlines driven by memory cells) placed along its respective portion of bitline BL. For example, output circuit $24_5$, associated with sub-array SA5, may be used for boundary routing between the FPGA and FPMA. In this case, the access time to this output circuit from sub-array SA5 is substantially different (shorter) than that from sub-array SA0. Further, as the chosen I/O port moves from SA5 to SA3 to SA0, the best case to worst case access time relationship will change significantly.

As the sub-array size, sub-array count, and I/O port count of the programmable memory array grow, the length and corresponding RC characteristics of these long bitlines increases and performance degrades considerably. Additionally, because any of the output circuits connectable to such a bitline may be used as the primary output, the electrical characteristics of the bitline, and therefore the timing rules associated with the array, are highly variable.

Therefore, a new memory array bitline structure is required, especially for large, high performance programmable memory arrays, which overcomes the above-identified problems of current bitline structures.

SUMMARY OF THE INVENTION

A new memory array bitline structure is provided in accordance with the principles of the present invention, which in one aspect, relates to a bitline structure including a first bitline segment for carrying a state determinable by a selected first bitline drive device coupled thereto, and a second bitline segment for carrying a state determinable by a selected second bitline drive device coupled thereto. A first controllable drive circuit is coupled to the first bitline segment, and a second controllable drive circuit is coupled to the second bitline segment. The second bitline segment is coupled to control the first controllable drive circuit, and the first bitline segment is coupled to control the second controllable drive circuit. The state of the first bitline segment is therefore provided to the second bitline segment upon activation of the selected first bitline drive device, and the state of the second bitline segment is provided to the first bitline segment upon activation of the selected second bitline drive device.

In a system where pre-charge/discharge techniques are used to access the bitline segments, the first and second controllable drive circuits may be each controllable into one of two modes, including a first, high impedance mode wherein any pre-charge state previously placed on the respective bitline segment is maintained, and a second, discharge mode wherein any pre-charge state previously placed on the segment is discharged.

Contention control may be provided by gates within the controllable drive circuits and controlled by a pre-charge control signal. This contention control mechanism of the instant invention keeps the respective controllable drive circuits in their high impedance modes when the pre-charge control signal is active, but allows the controllable drive circuits to be controlled by their respective bitline segments when the pre-charge control signal is inactive.

In another aspect, the present invention relates to a method for operating first and second conductively isolated bitline segments in a memory system, the first bitline segment having a plurality of first bitline drive devices coupled thereto, the second bitline segment having a plurality of second bitline drive devices coupled thereto. The first bitline segment is accessed with a given first bitline drive device such that the first bitline segment carries a state determined by the device. The first state is provided to the second bitline segment during the accessing using a circuit connected between the first and second bitline segments, such that both the first and second bitline segments carry the first state during the accessing. The accessing may include discharging the first bitline segment, or maintaining or reinforcing a pre-charge level previously placed on the first bitline segment. In this case, the second bitline segment is discharged

3 using the first circuit, or a pre-charge level previously placed on the second bitline segment is maintained or reinforced using the first circuit.

By segmenting the bitline discussed above with reference to FIG. 2, and providing the above-discussed cross-coupling between the segments of the segmented bitline, the RC characteristics of the bitline can be controlled without impacting the ability to bi-directionally transfer data along the entire bitline to output circuits connected to any one of the segments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

DETAILED DESCRIPTION OF THE PREFERRED EMBODIMENT(S)

Figure 3:
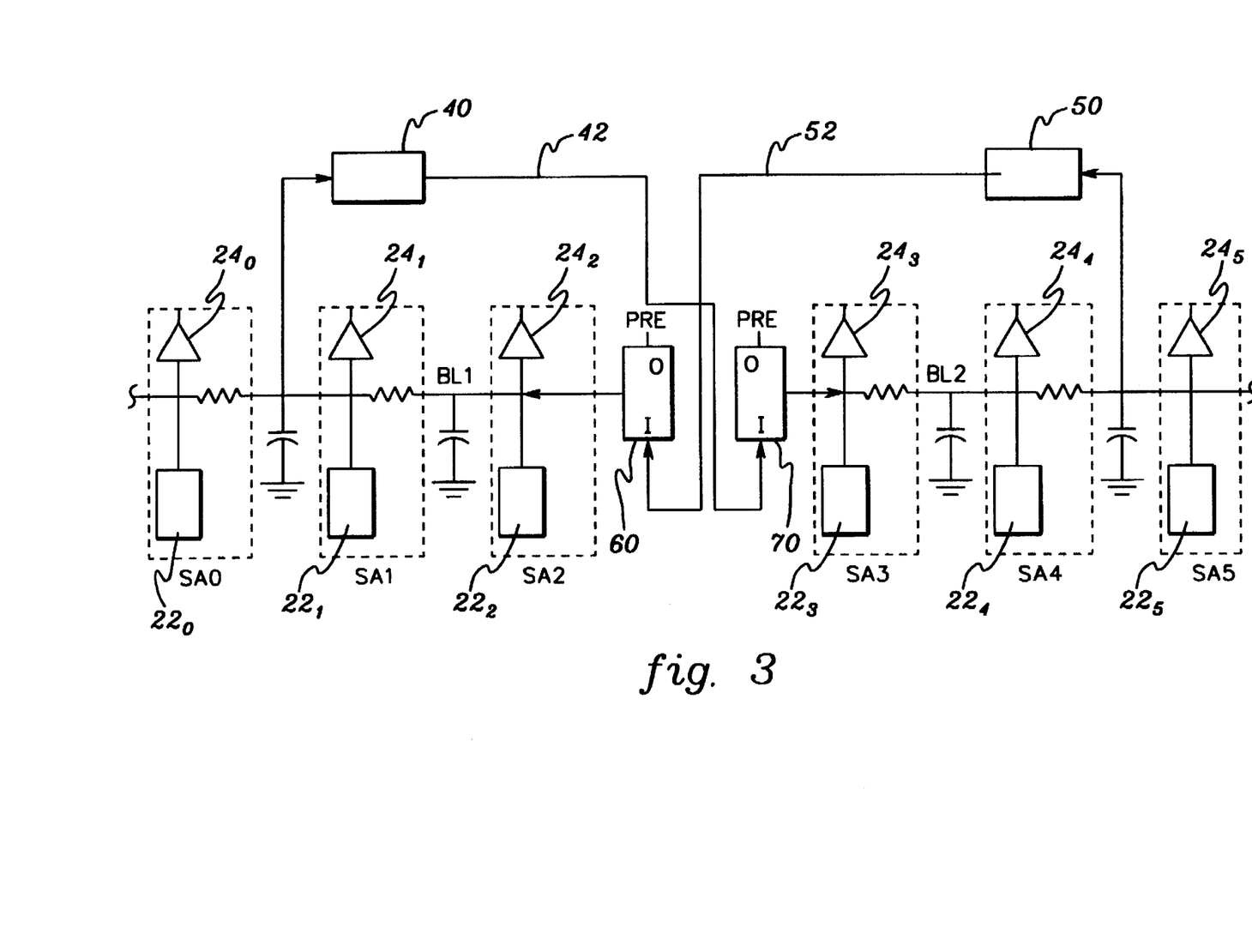
FIG. 3 depicts a segmented bitline including segments BL1 and BL2, and a block diagram of an apparatus used to cross-couple the segments in accordance with the principles of the present invention.

With reference to FIG. 3, an exemplary embodiment of a memory array bitline structure having cross-coupled bitline segments is shown in block diagram form, in accordance with the present invention. The original long bitline of FIG. 2 is segmented into at least 2 segments, BL1 and BL2, each servicing a portion of the bitline drive devices 22 and a portion of the I/O port devices 24. Because the bitline is now segmented, the drive devices in sub-arrays SA0 to SA5 may be reduced in size, scaling the effective RC of the structure faster than the scale of the bitline length, and improving transition times on the segment. To the structure, buffers 40 and 50 are also added. These bitline buffers preferably tap segments BL1 and BL2 at their center points, effectively reducing the RC time constant from any point on the segment to its respective buffer with resultant arrival time distribution improvement, but could be connected elsewhere with some resultant variance in performance. In the embodiment depicted, the outputs of buffers 40 and 50 are provided on output lines 42 and 52 respectively. Lines 42 and 52 are preferably single input, single output nets of low capacitance, and therefore low RC relative to their respective bitline segment BL1 or BL2, or to the original bitline BL of FIG. 2. Via lines 42 and 52 respectively, buffer 40 controls controllable drive circuit 70 and buffer 50 controls controllable drive circuit 60. Circuits 60 and 70 are shown coupled at the ends of segments BL1 and BL2 respectively, however, these units could alternatively connect to other points of BL1 and BL2 with small variances in electrical performance. Controllable drive circuits 60 and 70 provide the state of their respective driving bitlines (i.e., BL2 and BL1) to the bitlines respectively connected to their outputs (i.e., BL1 and BL2). The controllable drive circuits may also be controlled by a pre-charge control signal PRE such that proper pre-charge/discharge operation is maintained in embodiments in which bitlines BL1 and BL2 are so controlled (as discussed in greater detail below).

Bitlines BL1 and BL2 are therefore "cross-coupled" by the apparatus shown in FIG. 3, such that a state from BL1 is provided to BL2, (upon activation of a selected bitline drive device coupled to BL1) and a state from BL2 is provided to BL1 (upon activation of a selected bitline drive device coupled to BL2). To prevent conflicting states, the bitline drive devices along the entire segmented bitline may be individually activated in a mutually exclusive manner (using, for example, a set of wordlines).

The functional diagram of FIG. 3 is discussed in greater detail below with reference to the electrical schematic diagrams of FIGS. 4b–c and FIG. 5.

Figure 4A:
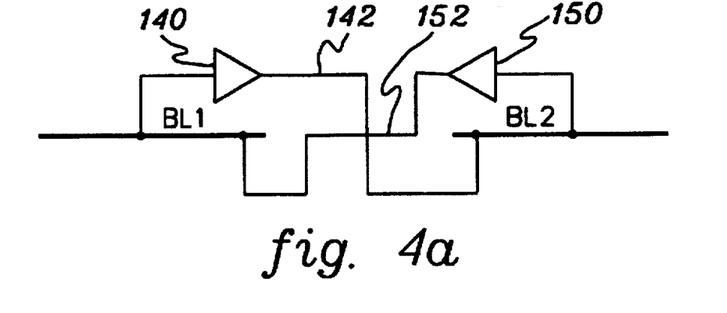
FIG. 4a is a schematic diagram of a first apparatus for cross-coupling bitline segments BL1 and BL2 in accordance with the principles of the present invention.
Figure 4B:
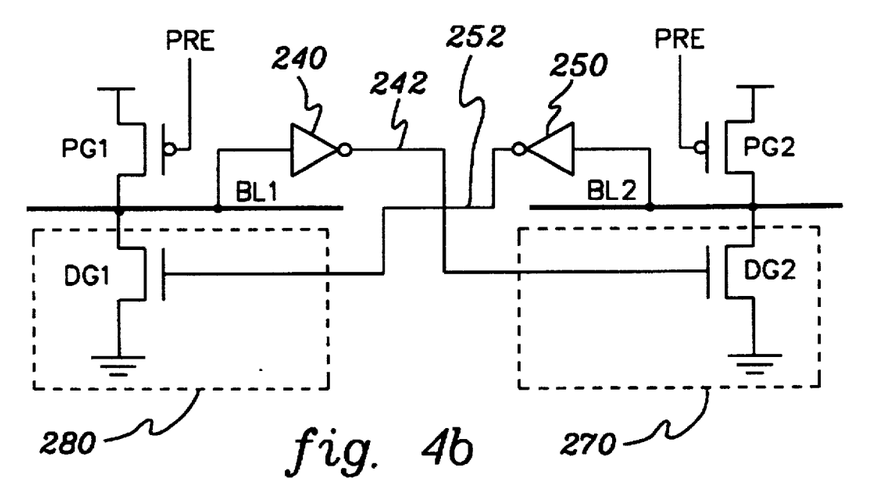
FIG. 4b is a schematic diagram of a second apparatus for cross-coupling bitline segments BL1 and BL2, in which the bitlines are operated using pre-charge/discharge techniques.
Figure 4C:
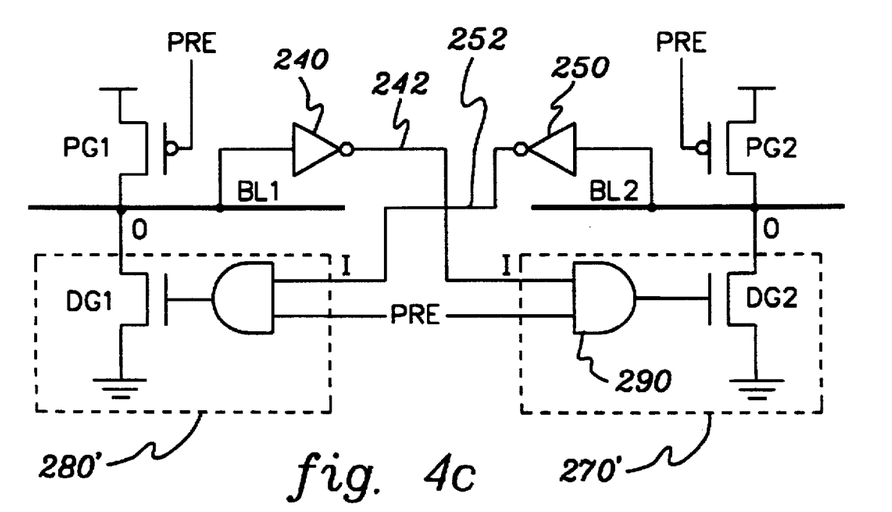
FIG. 4c is an enhancement to the embodiment of FIG. 4b in which a pre-charge control signal controls the controllable drive circuit in addition to its standard control of a conventional pre-charge transistor.

FIGS. 4a–c are electrical schematic diagrams of first and second exemplary systems for cross-coupling bitline segments BL1 and BL2 in accordance with the principles of the present invention. (No particular connection point location of the elements depicted in FIGS. 4a–c along bitlines BL1–BL2 should be inferred. These figures represent the electrical connectivity between the elements.)

With reference to FIG. 4a, shown therein is a first apparatus for cross-coupling bitline segments BL1 and BL2 in accordance with the present invention. A first controllable drive circuit 140 is shown having an input coupled to segment BL1 and an output coupled to segment BL2 (via line 142). A second controllable drive circuit 150 is shown having an input coupled to BL2 and an output coupled to BL1 (via line 152). Any asserted state on segment BL1 is therefore provided to segment BL2, and any state on segment BL2 is provided to segment BL1 using the controllable drive circuits 140 and 150.

With reference to FIG. 4b, shown therein is a second apparatus for cross-coupling bitline segments BL1 and BL2 in accordance with the present invention. Pre-charge control signal PRE (in this embodiment active low) is used to place a charge on segments BL1 and BL2 via pre-charge gates PG1 and PG2. Controllable drive circuit 270, in this embodiment a discharge transistor DG2, is controlled by inverting buffer 240 (via line 242) and is therefore controlled by the state of bitline segment BL1. A similar arrangement is formed using inverting buffer 250 driven by bitline segment BL2 for controlling controllable drive circuit 280 (via line 252). A logic "0" on bitline segment BL1 will discharge bitline segment BL2. Similarly, a logic "0" on bitline segment BL2 will discharge bitline segment BL1. A logic "1" value on either bitline segment BL1 or bitline segment BL2, in contrast, (and in addition to maintaining or reinforcing the pre-charge on BL1 and BL2) will keep the respective discharge transistors DG2 and DG1 off, thereby maintaining the charge on bitline segments BL2 and BL1. Reinforcing this charge is possible also, in other embodiments.

With reference to FIG. 4c, which is an enhancement to the embodiment of FIG. 4b, enhanced controllable drive circuit 270' includes both discharge transistor DG2 and an additional AND gate 290. The AND gate has as its inputs the output of the inverting buffer 240, as well as pre-charge control signal PRE. This embodiment of controllable drive circuit 270' will prevent the state of bitline segment BL1 from interfering with pre-charge cycles on BL2 which are controlled by pre-charge control signal PRE. AND gate 290 keeps controllable drive circuit 270' in its high impedance mode while the pre-charge control signal is active (in this embodiment, active low). If pre-charge control signal PRE is inactive (in this embodiment, inactive high), the output of AND gate 290 is controlled by the state on bitline segment BL1 via inverting buffer 240, and discharge gate DG2 is controlled accordingly. Enhanced controllable drive circuit 280' is similarly implemented.

Figure 5:
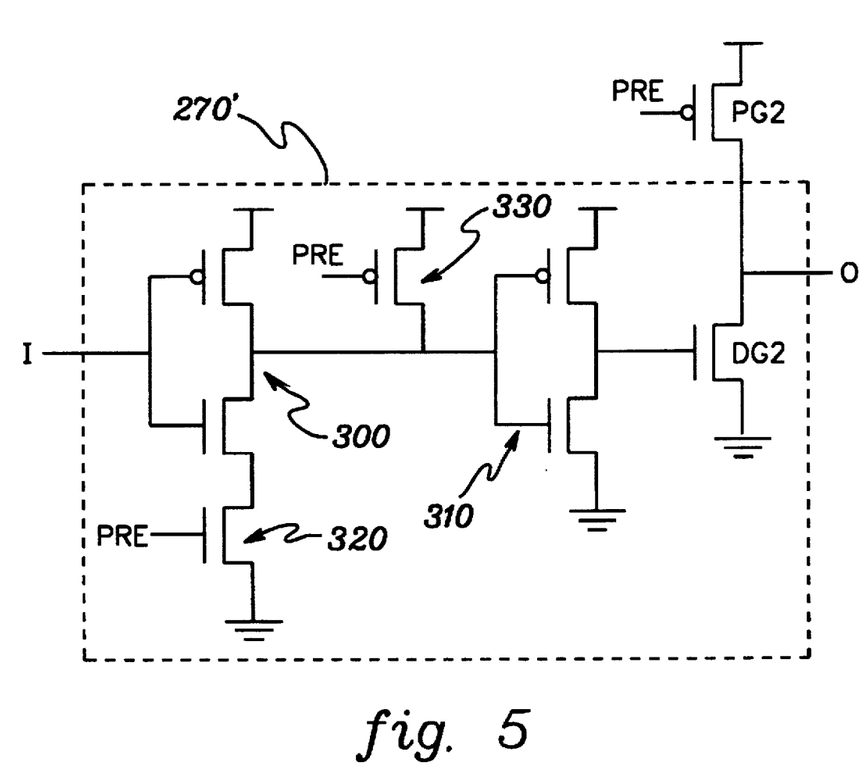
FIG. 5 is a more detailed electrical schematic of a controllable drive circuit depicted in FIG. 4c.

FIG. 5 is a more detailed electrical schematic of the controllable drive circuit 270' depicted in FIG. 4c. Inverters 300 and 310 are coupled in series between the input node I and the gate of the discharge gate DG2. The first inverter 300 is activated by an inactive high pre-charge control signal using transistor 320, but is inactivated by an active low pre-charge control signal. The second inverter 310 is forced to a fixed output state by an active low pre-charge control signal using transistor 330. Inverters 300 and 310, and transistors 320 and 330, therefore provide the function of the AND gate 290 depicted in FIG. 4c.

It should be recognized that given the function required, other alternative FET structures could be implemented by one skilled in the art which with varying performance/density characteristics would meet the functional specifications necessary to effectively cross-couple the bitline segments. Further, the pre-charge gates PG1 and PG2 need not be simple PFETs, but could be a structure which pre-charges to ground, or some value offset by one or more Vts from a rail as required by the sensing structures in the I/O ports. In this regard, no particular polarity or voltage levels should be implied by the terms "pre-charge" and "discharge," which should be construed broadly when used herein. Similarly, the terms "drive" and "drive device" should be construed broadly herein, for example, as associated with an active technique to place a node at a certain potential (e.g., discharge), and/or a passive technique to keep a node at a certain potential (e.g. high impedance).

Operational Description

With reference to FIGS. 3, 4c and 5, at the beginning of a bitline access cycle, the pre-charge control line (PRE) goes inactive (high), preparing the controllable drive circuit 270' for transition. The pre-charged bitline segment BL1 remains stable (pre-charged high in this example, with stability provided by devices known to those skilled in the art) until a bitline access is made. An activation of a bitline drive device in, e.g., SA0, will drive a state onto bitline segment BL1. If this state is logic "1" polarity, no bitline transition will take place and bitline segment BL1 retains its previously placed pre-charge level. If a logic "0" polarity state is driven, a discharge occurs and a falling edge will be propagated along bitline segment BL1. The edge propagates on BL1 with a delay determined by the RC constant of the segment, and in time is available for sensing by I/O ports 24 associated with SA0–SA2 of the array. When the edge reaches the input to inverting buffer 240, it is regenerated as a rising edge, and driven on a low RC line 242 to controllable drive circuit 270'. AND gate 290 therein generates a logic value of "1" turning the discharge gate DG2 on, and duplicating the discharge of BL1 on bitline segment BL2. Data is therefore regenerated and passed between segments and made available to the I/O ports of SA3–SA5 connected along segment BL2. After a slight delay, the discharge of BL2 will be mirrored in inverting buffer 250 and DG2 of controllable drive circuit 280' will provide an additional pulldown of BL1. At the end of the cycle, the bitline drive device associated with SA0 is deactivated.

To ensure that both segments of the bitline can be pre-charged without contention, skew and resultant power consumption, the activation of the pre-charge control signal PRE disables the discharge gates DG1 and DG2 (via the AND gates) and enables the pre-charge devices PG1 and PG2 (the active pre-charge pulse also may be delayed to account for DG turnoff). In following cycles, other arrays connected to the bitline may be accessed in a similar manner and effective bi-directional travel is allowed along the entire bitline comprised of its segments.

Performance of the disclosed bitline system is therefore improved, over the bitline system of FIG. 2, as any bitline drive device, either from a sub-array (SA) or from a controllable drive circuit drives a bitline of shorter length, as well as only one half of the I/O or driver diffusions shown in FIG. 2. This performance improvement is derived both from direct RC reduction obtained by conductive isolation of the bitline segments, and secondary reductions resulting from the reduction of bitline drive device sizes.

Although by example, segmenting of the bitline into two segments is discussed above, one skilled in the art should recognize that the architecture presented is easily extendable to more than two segments and is further modifiable to support different numbers of sub-arrays.

Additionally, one skilled in the art would recognize that although the controllable drive circuit embodiments depicted in FIGS. 4 and 5 operate as a function of bitline-segment input and pre-charge control only, additional functional control capability could be provided using configuration techniques common to field programmable gate arrays (FPGAs), or disclosed in the above-incorporated U.S. patent application entitled "Field Programmable Memory Array". This added capability may take the form of selectively enabling or disabling individual controllable drive circuits within the structure such that output from a single bitline drive device coupled to a bitline segment may be propagated over multiple bitline segments, or alternatively propagated within a smaller subset of bitline segments in a manner that would allow multiple bitline segments to be used for parallel propagation of data.

While the invention has been particularly shown and described with reference to preferred embodiment(s) thereof, it will be understood by those skilled in the art that various changes in form and details may be made therein without departing from the spirit and scope of the invention.

What is claimed is:

1. A memory array bitline structure comprising:
   a first bitline segment for carrying a state determinable by a selected first bitline drive device of a plurality of first bitline drive devices coupled thereto;
   a second bitline segment for carrying a state determinable by a selected second bitline drive device of a plurality of second bitline drive devices coupled thereto;
   a first controllable drive circuit coupled to said first bitline segment; and
   a second controllable drive circuit coupled to said second bitline segment;
   wherein said second bitline segment is coupled to control said first controllable drive circuit and said first bitline segment is coupled to control said second controllable drive circuit such that the state of the first bitline segment is provided to the second bitline segment upon activation of the selected first bitline drive device and the state of the second bitline segment is provided to the first bitline segment upon activation of the selected second bitline drive device.

2. The memory array bitline structure of claim 1, further comprising:

a first buffer having an input coupled to said first bitline segment and an output coupled to control said second controllable drive circuit, said second controllable drive circuit thereby being controlled according to the state of said first bitline segment; and a second buffer having an input coupled to said second bitline segment and an output coupled to control said first controllable drive circuit, said first controllable drive circuit thereby being controlled according to the state of said second bitline segment.

3. The memory array bitline structure of claim 1, wherein said first and second controllable drive circuits are each controllable into one of two modes, comprising:

a first, high impedance mode wherein any pre-charge state previously placed on the respective bitline segment is maintained; and a second, discharge mode wherein any pre-charge state previously placed on the respective bitline segment is discharged.

4. The memory array bitline structure of claim 3, wherein either said selected first or second bitline drive device, upon an activation thereof, drives its respective bitline segment by:

maintaining any pre-charge state previously placed on the respective bitline segment; or discharging from the respective bitline segment any pre-charge state previously placed on the respective bitline segment.

5. The memory array bitline structure of claim 4, further comprising:

a first pre-charge circuit coupled to said first bitline segment for placing a pre-charge state on said first bitline segment prior to the activation of the selected first bitline drive device and in accordance with a pre-charge control signal; and a second pre-charge circuit coupled to said second bitline segment for placing the pre-charge state on said second bitline segment prior to the activation of the selected second bitline drive device and in accordance with the pre-charge control signal.

6. The memory array bitline structure of claim 5, further comprising:

a first buffer having an input coupled to said first bitline segment and an output coupled to control said second controllable drive circuit, said second controllable drive circuit thereby being controlled according to the state of said first bitline segment; and a second buffer having an input coupled to said second bitline segment and an output coupled to control said first controllable drive circuit, said first controllable drive circuit thereby being controlled according to the state of said second bitline segment.

7. The memory array bitline structure of claim 5, wherein:

said first controllable drive circuit includes a first gate having a first input controlled by said second bitline segment and a second input controlled by the pre-charge control signal, said first gate having an output controlling said first controllable drive circuit;

said second controllable drive circuit includes a second gate having a first input controlled by said first bitline segment and a second input controlled by the pre-charge control signal, said second gate having an output controlling said second controllable drive circuit; and the first and second gates control their respective outputs to thereby keep their respective controllable drive circuits in their high impedance modes while the pre-charge control signal is active, and allow their respective first inputs to control their respective outputs and therefore their respective controllable drive circuits when the pre-charge control signal is inactive.

8. The memory array bitline structure of claim 7, wherein the pre-charge control signal is active low, and wherein said first gate comprises a first AND gate and said second gate comprises a second AND gate.

9. The memory array bitline structure of claim 8, further comprising:

a first inverting buffer having an input coupled to said first bitline segment and an output coupled to the first input of the second AND gate, said second controllable drive circuit thereby being controlled according to the state of said first bitline segment when the pre-charge control signal is inactive; and a second inverting buffer having an input coupled to said second bitline segment and an output coupled to the first input of the first AND gate, said first controllable drive circuit thereby being controlled according to the state of said second bitline segment when the pre-charge control signal is inactive.

10. The memory array bitline structure of claim 9, wherein said first and second controllable drive circuits assume their first, high impedance modes when the output of their respective AND gate is low, and assume their second, discharge modes when the output of their respective AND gate is high.

11. The memory array bitline structure of claim 10, wherein each of said first and second AND gates comprises:

first and second inverters connected in series between the respective first input of the AND gate and the respective output of the AND gate, the first inverter being inactivated by an active pre-charge control signal at the second input of the AND gate, the second inverter being forced to a fixed output state by an active pre-charge control signal at the second input of the AND gate.

12. The memory array bitline structure of claim 11, wherein said first and second controllable drive circuits each comprises a discharge transistor coupled between its respective bitline segment and a discharge potential.

13. The memory array bitline structure of claim 5, wherein said first and second controllable drive circuits each comprises a discharge transistor coupled between its respective bitline segment and a discharge potential.

14. The memory array bitline structure of claim 1, wherein the pluralities of first and second bitline drive devices comprise mutually exclusively activatable memory cells driving said first and second bitline segments.

15. The memory array bitline structure of claim 1, further comprising:

a plurality of first output circuits coupled to said first bitline segment for transmitting the state thereof; and a plurality of second output circuits coupled to said second bitline segment for transmitting the state thereof;

wherein the plurality of first output circuits is driven by the state of the first and second bitline segments, and the plurality of second output circuits is driven by the state of the first and second bitline segments.

16. The memory array bitline structure of claim 1, comprising:

at least three bitline segments including said first and second bitline segments; and multiple controllable drive circuits, including said first and second controllable drive circuits, wherein any state of any one of said at least three bitline segments determined by an activated bitline drive device coupled thereto is provided to the remaining bitline segments of said at least three bitline segments via said multiple controllable drive circuits.

17. A system for operating first and second conductively isolated bitline segments in a memory system, the first bitline segment having a plurality of first bitline drive devices coupled thereto, the second bitline segment having a plurality of second bitline drive devices coupled thereto, the system comprising:

means for accessing the first bitline segment with a given first bitline drive device of the plurality of first bitline drive devices such that the first bitline segment carries a first state determined by the given first bitline drive device; and a first circuit for providing the first state to the second bitline segment while accessing the first bitline segment, the first circuit connected between the first and second bitline segments, such that both the first and the second bitline segments carry the first state while accessing the first bitline segment.

18. The system of claim 17, further comprising:

means for accessing the second bitline segment with a given second bitline drive device of the plurality of second bitline drive devices, such that the second bitline segment carries a second state determined by the given second bitline drive device; and a second circuit for providing the second state to the first bitline segment while accessing the second bitline segment, the second circuit connected between the first and second bitline segments, such that both the first and second bitline segments carry the second state while accessing the second bitline segment.

19. The system of claim 18, further comprising:

a first output device coupled to the first bitline segment to carry the second state therefrom while accessing the second bitline segment; and a second output device coupled to the second bitline segment to carry the first state therefrom while accessing the first bitline segment.

20. The system of claim 17, wherein:

said means for accessing the first bitline segment includes means for discharging the first bitline segment; and said first circuit includes means for discharging the second bitline segment.

21. The system of claim 17, wherein:

said means for accessing the first bitline segment includes means for maintaining or reinforcing a pre-charge level previously placed on the first bitline segment; and said first circuit includes means for maintaining or reinforcing a pre-charge level previously placed on the second bitline segment.

22. The system of claim 17, further comprising:

means for pre-charging the first and second bitline segments with a pre-charge level using a pre-charge control signal; and means for using the pre-charge control signal to control the first circuit during said pre-charging.

23. The system of claim 22, wherein said means for using the pre-charge control signal includes means for preventing the first circuit from discharging the second bitline segment while pre-charging the first and second bitline segments.

24. A method for operating first and second conductively isolated bitline segments in a memory system, the first bitline segment having a plurality of first bitline drive devices coupled thereto, the second bitline segment having a plurality of second bitline drive devices coupled thereto, the method comprising:

(a) accessing the first bitline segment with a given first bitline drive device of the plurality of first bitline drive devices such that the first bitline segment carries a first state determined by the given first bitline drive device; and (b) providing the first state to the second bitline segment during said accessing (a) using a first circuit connected between the first and second bitline segments, such that both the first and the second bitline segments carry the first state during said accessing the first bitline segment (a).

25. The method of claim 24, further comprising:

(c) accessing the second bitline segment with a given second bitline drive device of the plurality of second bitline drive devices, such that the second bitline segment carries a second state determined by the given second bitline drive device; and (d) providing the second state to the first bitline segment during said accessing (c) using a second circuit connected between the first and second bitline segments, such that both the first and second bitline segments carry the second state during said accessing the second bitline segment (c).

26. The method of claim 25, further comprising:

(e) using the first bitline segment to drive the second state through a first output device coupled to the first bitline segment during said accessing the second bitline segment (c); and (f) using the second bitline segment to drive the first state through a second output device coupled to the second bitline segment during said accessing the first bitline segment (a).

27. The method of claim 24, wherein:

said accessing the first bitline segment (a) includes discharging the first bitline segment; and said providing the first state to the second bitline segment (b) includes discharging the second bitline segment using said first circuit.

28. The method of claim 24, wherein:

said accessing the first bitline segment (a) includes maintaining or reinforcing a pre-charge level previously placed on the first bitline segment; and said providing the first state to the second bitline segment (b) includes maintaining or reinforcing a pre-charge level previously placed on the second bitline segment.

29. The method of claim 24, further comprising, prior to said accessing the first bitline segment (a):

(c) pre-charging the first and second bitline segments with a pre-charge level using a pre-charge control signal; and (d) using the pre-charge control signal to control the first circuit during said pre-charging (c).

30. The method of claim 29, wherein said using the pre-charge control signal (d) includes preventing the first circuit from discharging the second bitline segment during said pre-charging (c).

* * * * *